United States Patent [19]

Metz

[11] Patent Number: 5,157,276
[45] Date of Patent: Oct. 20, 1992

[54] LOW JITTER CLOCK PHASE ADJUST SYSTEM

[75] Inventor: Arthur J. Metz, Gervais, Oreg.

[73] Assignee: Tektronix, Inc., Wilsonville, Oreg.

[21] Appl. No.: 765,785

[22] Filed: Sep. 26, 1991

[51] Int. Cl.[5] .......................... H03K 5/00; H03K 5/13
[52] U.S. Cl. .................................... 307/262; 307/529;
307/608; 328/155; 328/55
[58] Field of Search ............... 307/511, 529, 262, 271,
307/608; 328/14, 15, 155, 162, 133, 137, 156, 55

[56] References Cited

U.S. PATENT DOCUMENTS

| | | |
|---|---|---|
| 3,978,407 | 8/1976 | Formey et al. ...................... 328/162 |
| 4,035,735 | 7/1977 | Akashi et al. ........................ 328/155 |
| 4,692,931 | 9/1987 | Ohsawa ................................ 307/527 |
| 4,808,936 | 2/1989 | Lamb . | 
| 4,868,428 | 9/1989 | Cooper ................................. 307/511 |

Primary Examiner—Janice A. Howell
Assistant Examiner—Toan Tran
Attorney, Agent, or Firm—Francis I. Gray

[57] ABSTRACT

A low jitter clock phase adjust system divides an input clock signal into three clock signals having precisely equal phase differences from each other. The three clock signals are converted into current vectors and input to a trio of two-quadrature multipliers. The current vectors are multiplied by separate control signals generated from an input phase control signal. The separate control signals are generated such that only one of the separate control signals varies at a time. The result is a phase response output that is a linear function of the input phase control signal and that provides a phase adjustment range from $-60°$ to $360°$.

8 Claims, 5 Drawing Sheets

LOW JITTER CLOCK PHASE ADJUST SYSTEM

BACKGROUND OF THE INVENTION

The present invention relates to clock delay circuits, and more particularly to a low jitter clock phase adjust system for continuously varying the phase of a sinusoidal clock signal over a range of greater than three hundred sixty degrees (360°).

Many test instruments, such as oscilloscopes, derive all timing information from a master clock. An example of an extremely stable master clock is a surface acoustic wave (SAW) oscillator that is capable of generating a sine wave at a high frequency.

It is desirable in some cases to increase the sampling rate of sample and hole circuits that receive data to be higher than the system clock rate. This is achieved by accurately interleaving samples by skewing the clock by a precise amount to provide multiple clocks having a fixed phase relationship to each other.

It has been possible to generate delayed clock pulses from a sinusoidal input by using a comparator amplifier having an RC integrator network as the input. The RC network includes a variable resistor that alters the slope of the input clock pulses, and hence the point at which the comparator switches from a high state to a low state. The effect of this circuit is that, as the slope flattens out, the phase of the output pulses becomes retarded in time with respect to the input pulses because the comparator is triggered at a later time during each cycle. However the input to the comparator frequently includes jitter and high frequency noise that causes uncertainty as to the time when the input pulse edges encounter the threshold of the comparator. The result is jitter in the output pulses.

One prior attempt to solve this problem is described in U.S. Pat. No. 4,808,936, issued to James S. Lamb on Feb. 28, 1989 and entitled "Continuously Variable Clock Delay Circuit". This attempt uses quadrature components of the input clock signal that are input to respective four-quadrant multipliers, such as those described in U.S. Pat. No. 4,156,283, issued to Barrie Gilbert on May 22, 1979 entitled "Multiplier Circuit." Control signals are applied to each multiplier to determine how much of each component is passed on to a summing circuit. The control signals may vary from minus one to plus one. The resulting vector addition produces an output clock that is delayed in phase from the input clock signal by a relatively precise amount.

However the four-quadrant multipliers used by Lamb are noisy when operated in midrange, i.e., when balanced. Even when the multipliers are balanced so that there is no contribution to the sum from one quadrature component, such noise causes some jitter in the output signal. Further without additional compensation circuitry the amplitude of the output of the summation circuit varies from one, whereon only one quadrature component contributes to the output, to 1.4, a forty percent amplitude change, when both quadrature components contribute equally to the output. Also the fact that the four-quadrant multipliers tie the collectors together introduces additional capacitance in the circuit, which may require a common base stage at the summing nodes at the outputs of the multipliers. This additional amplification stage may in turn require a larger power supply with the attendant greater power usage.

What is desired is a low jitter clock phase adjust system that reduces the noise due to the use of multipliers, reduces the circuit capacitance, provides a more constant amplitude output and requires a lower voltage power supply for reduced power usage.

SUMMARY OF THE INVENTION

Accordingly the present invention provides a low jitter clock phase adjust system that divides an input clock signal into three components one hundred twenty degrees (120°) out of phase with each other. The three clock components are input to a trio of two-quadrant multipliers configured such that only one multiplier at a time is in transition at any given time or phase angle. A control circuit converts an input control voltage into control currents for the multipliers to provide an essentially linear variation over a greater than three hundred sixty degree (360°) range.

The objects, advantages and other novel features of the present invention are apparent from the following detailed description when read in conjunction with the appended claims and attached drawing.

DESCRIPTION OF THE PREFERRED EMBODIMENT

Figure 1:
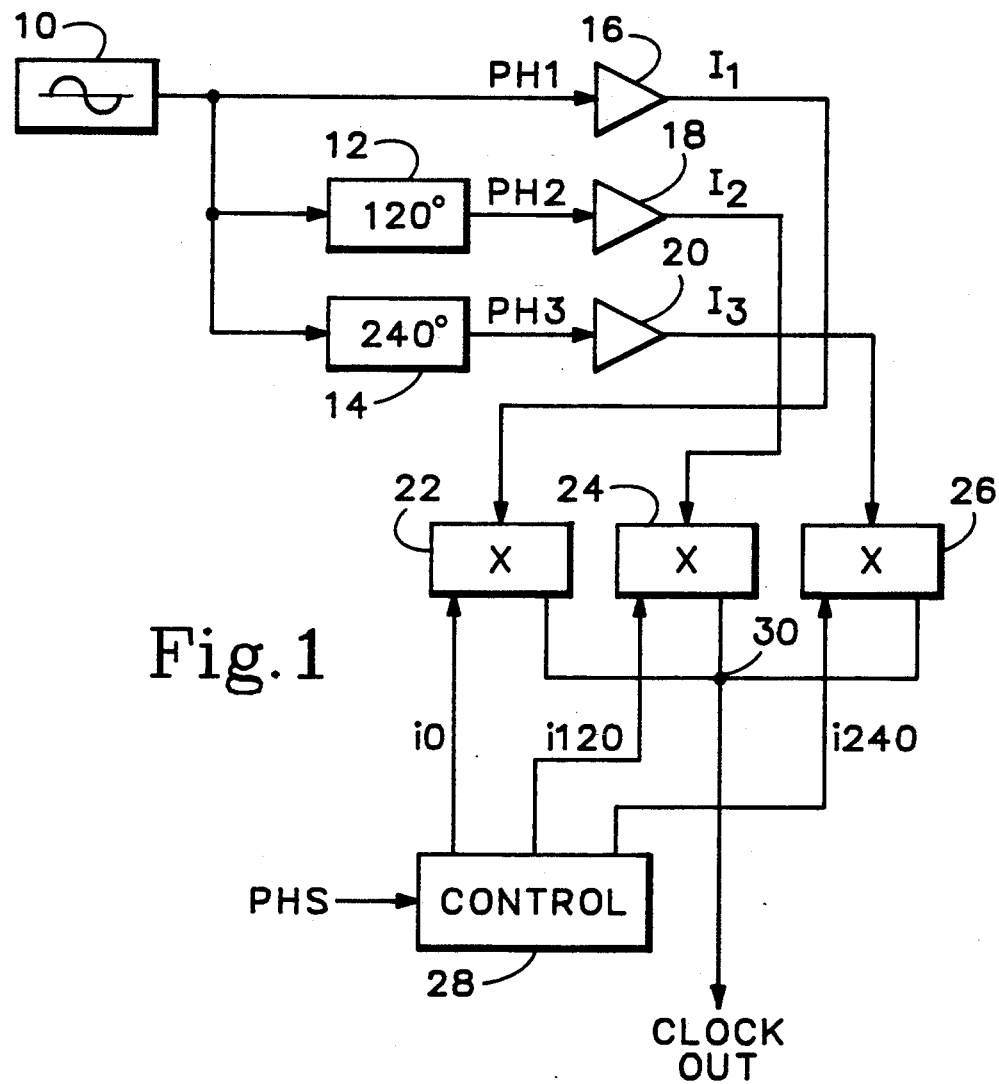
FIG. 1 is a block diagram of a low jitter clock phase adjust system according to the present invention.

Referring now to FIG. 1 an oscillator 10, such as an extremely stable SAW oscillator, is divided into three phases PH1, PH2 and PH3 by appropriate precision delay elements 12, 14. The three phases are separated from each other by one hundred twenty degrees (120°). The precision delay elements 12, 14 may be different length strip line structures, as is well known in the art, for a fixed sinewave output from the oscillator 10. The three phases PH1, PH2 and PH3 are input to respective voltage to current converters 16, 18, 20 to produce three differential current vectors I1, I2, I3 having phases at zero, 120 and 240 degrees relative to each other. The three current vectors I1, I2, I3 are input to a trio of two-quadrant multipliers 22, 24, 26 with currents I1 and nI1 being input to the first multiplier, currents I2 and nI2 being input to the second multiplier, and currents I3 and nI3 being input to the third multiplier, "n" indicating a "not" function. A control circuit 28 in response to a phase control signal PHS provides three control currents i0, i120, i240 that are applied to the respective multipliers. The outputs of the multipliers 22, 24, 26 are summed, typically at a summing node 30, to produce a low jitter phase adjusted clock signal output. For any particular phase of the clock signal output, at most only one of the multipliers 22, 24, 26 is in a transitional state while another is fully ON and the other is fully OFF. Since multipliers produce the most noise when operating in their linear range and the least noise when either fully ON or OFF, then with only one multiplier transitioning the least noise is produced.

Figure 2:
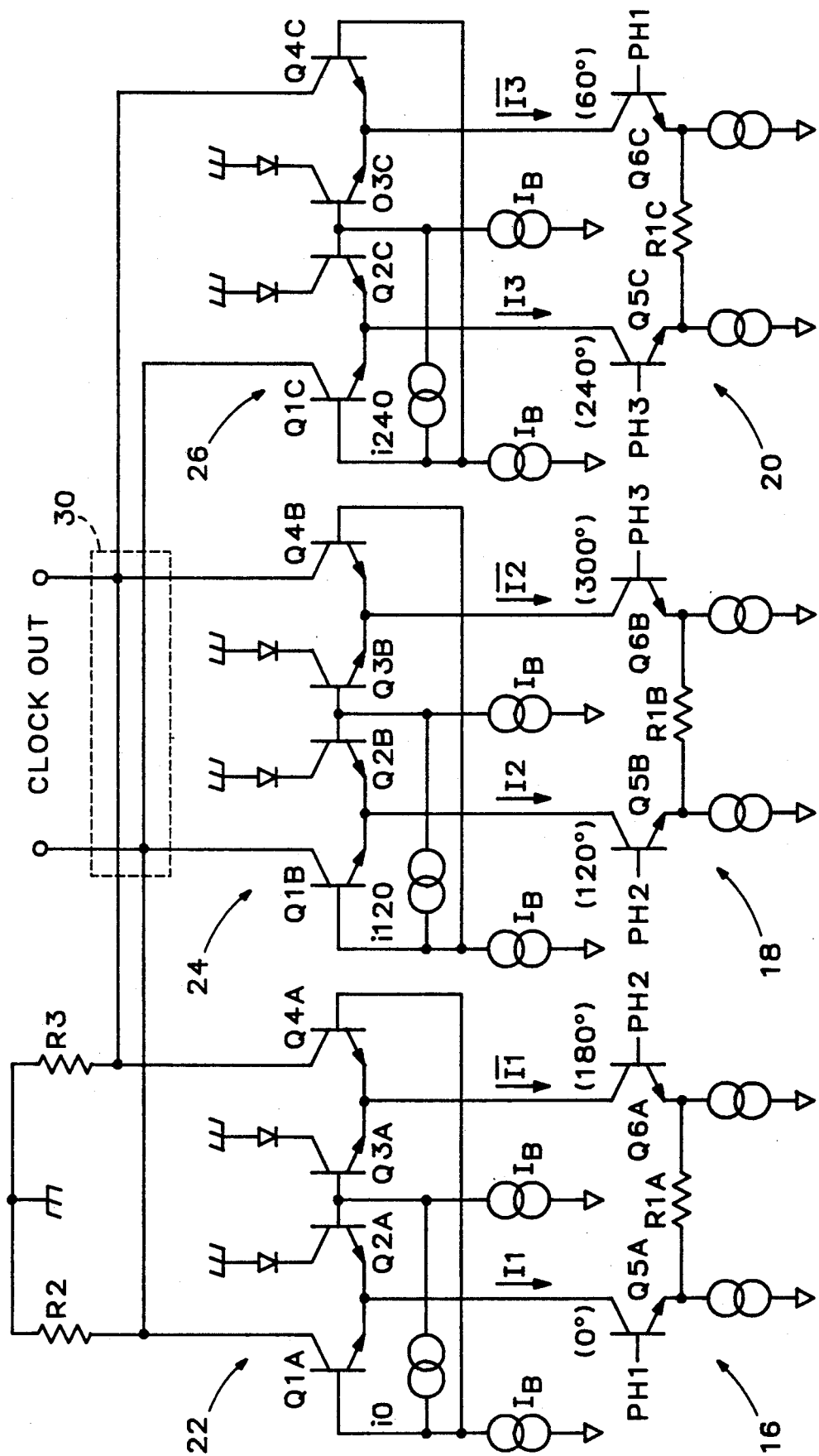
FIG. 2 is a partial schematic diagram of the multiplier portion of the low jitter clock phase adjust system of FIG. 1.
Figure 3:
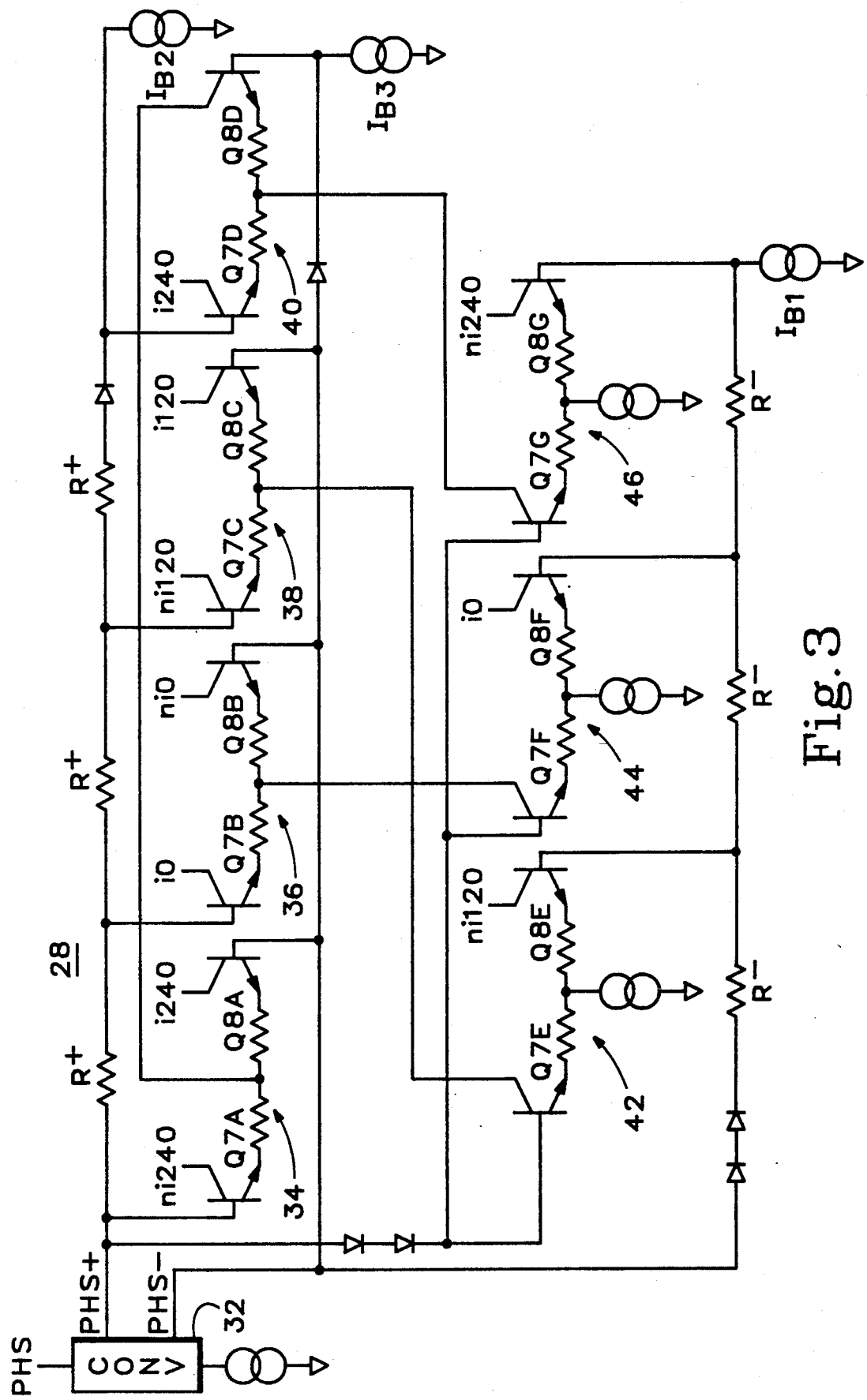
FIG. 3 is a partial schematic diagram of the control portion of the low jitter clock phase adjust system of FIG. 1.

The low jitter clock phase adjust system is shown in greater detail in FIGS. 2 and 3. Each two-quadrant multiplier 22, 24, 26 has two pairs of transistors Q1, Q2; Q3, Q4 with the bases being cross-coupled, such that the base of Q1 is coupled to the base of Q4 and the base of Q2 is coupled to the base of Q3. The bases also are coupled to a bias current source Ib. The collectors of Q1 and Q4 are coupled to the summing node 30 and to load resistors R2, R3. The collectors of Q2 and Q3 are coupled to ground. The control currents i0, i120, i240 are coupled between the bases of Q1 and Q2. The emitters of Q1 and Q2 are coupled together and the emitters of Q3 and Q4 are coupled together. Each voltage-to-current converter 16, 18, 20 has a pair of emitter coupled transistors Q5, Q6 with adjacent phases of the clock signal applied to the bases, i.e., PH1 and PH2 are applied to the bases of Q5A and Q6A respectively, etc. The emitters are resistively coupled via resistors R1 with individual current sources coupled to each emitter. The collectors of the transistors Q5, Q6 are coupled to the emitter junctions of the transistor pairs Q1, Q2; Q3, Q4 to provide current to the multipliers 22, 24, 26. Although the signals PH1, PH2, PH3 applied to the bases of transistors Q5, Q6 of the voltage-to-current converters 16, 18, 20 are shown as adjacent clock phase signals, either the base of Q5 or the base of Q6 may be connected to a reference bias voltage so that only one clock phase signal is input to each voltage-to-current converter.

The controller circuit 28 has a conventional input converter 32 that converts the single-ended voltage phase control signal PHS to a differential phase control signal PHS+, PHS−. A plurality of current switches 34-46, each having a pair of emitter coupled transistors Q7, Q8, are coupled to receive the PHS+ and PHS− signals. Current switch 34 is coupled directly between the PHS+ and PHS− signals at the bases of Q7A and Q8A. Likewise PHS− is coupled directly to the base of transistor Q8 in each of current switches 36, 38 and by a junction drop to the base of transistor Q8D. Likewise via two junction drops PHS+ is coupled directly to the bases of transistor Q7 in each of current switches 42, 44, 46. A resistor ladder of series resistors R+ couples PHS+ to the bases of transistors Q7 in each of the current switches 36, 38, 40. Likewise via two junction drops a resistor ladder of series resistors R− couples PHS− to the bases of transistors Q8 in each of the current switches 42, 44, 46. Current sources Ib1, Ib2 supply current to the resistor ladders R+, R−. The output of current switch 34 is the i240 control signal, the output of current switch 36 is the i0 control signal, and the output of current switch 38 is the i120 control signal. The collector of transistor Q7D of current switch 40 is wire ORed with the i240 output of current switch 34, and the collector of transistor Q8D is coupled as a current source for current switch 34. Likewise the collector of Q7E is coupled as a current source for current switch 38 and the collector of Q8E is wire ORed with the ni120 output of current switch 38, the collector of Q7F is coupled as a current source for current switch 36 and the collector of Q8F is wire ORed with the i0 output of current switch 36, and the collector of Q7G is coupled as a current source for current switch 40 and the collector of Q8G is wire ORed with the ni240 output of current switch 34. Each of current switches 42, 44, 46 has a fixed current source coupled to the emitters.

Figure 4A:
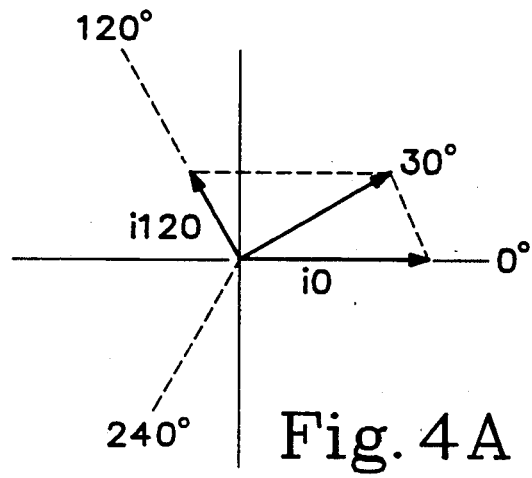
FIG. 4A and 4B are graphs illustrating in vector form the phase adjustments according to the present invention.
Figure 4B:
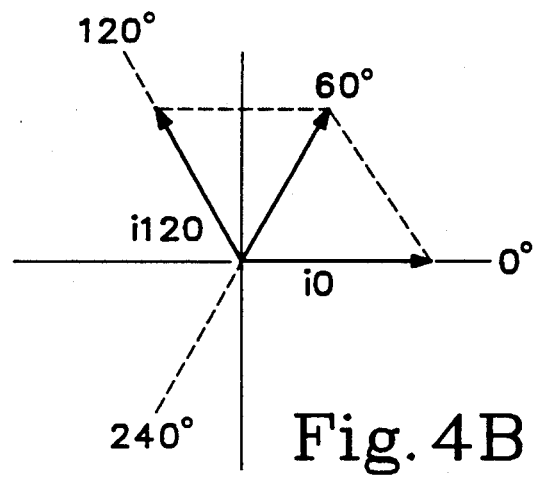

In operation the voltage-to-current converters 16, 18, 20 provide three current vectors I1, I2, I3 that are 120° out of phase with each other. The multipliers 22, 24, 26 multiply the three current vectors, represented by PH1, PH2, PH3 by the appropriate phase control signal i0, i120, i240 and the resulting scaled vectors are summed. As shown in FIG. 4A with i0 at unity (on), i120 at one-half and i240 at zero (off), the resulting clock output has a resultant phase of 30° with an amplitude of 0.866, a less than fifteen percent amplitude variation. Likewise as in FIG. 4B with i0 at unity, i120 at unity and i240 at zero, the resultant phase of the clock output is 60° with an amplitude equal to unity.

Figure 5:
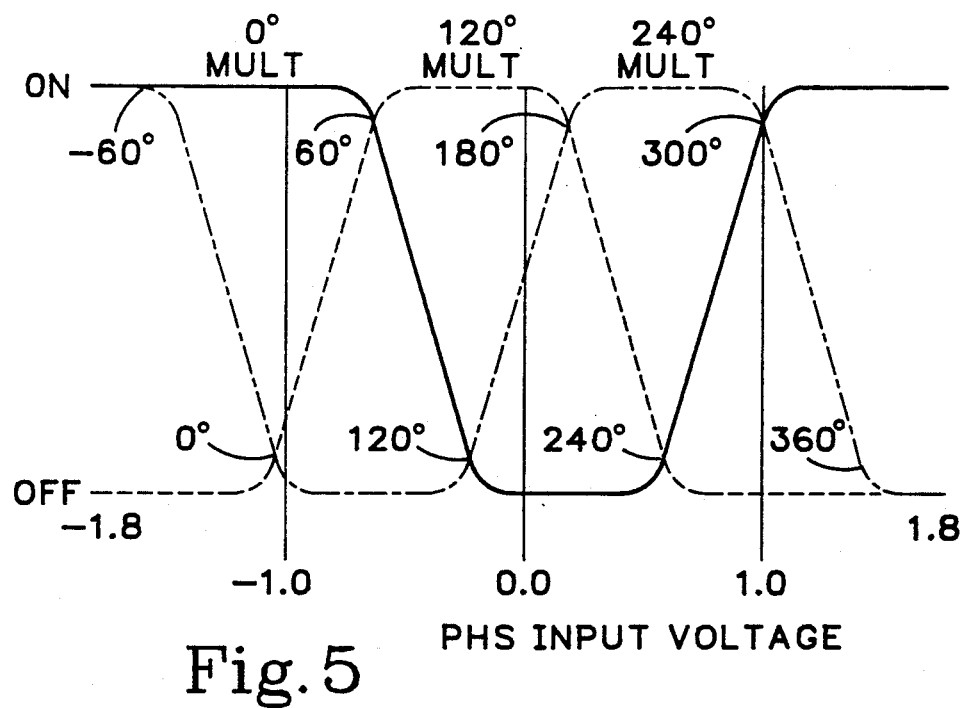
FIG. 5 is a graph of the control currents for the multipliers used in the present invention.

Referring now to FIG. 5 in conjunction with FIG. 3 the generation of the control signals i0, i120, i240 as a function of the input phase control signal PHS is described. When PHS is at its negative limit, determined by the current sources Ib1, Ib2 and ladder resistors R+, R−, approximately −1.5 volts for this example, PHS− is negative, shutting off all of the transistors Q8 in the current switches 34-46, while PHS+ is positive, turning on all of the transistors Q7. As a result current switches 42, 44, 46 provide current to switches 36-40 while no current is provided to switch 34. Switch 36 provides i0, switch 38 provides ni120 and switch 40 provides i240. As a result current vector I1 is added to current vector I3 to produce a resultant phase of the clock output of −60°. When PHS is slightly less than negative one volt, i.e., −1.05 volts, transistor Q8D conducts and transistor Q7D is cut-off. Q8D then acts as a current source via transistor Q7G for current switch 34. Thus Q7A provides current ni240, Q7B provides current i0 and Q7C provides current ni120. The vector addition of these currents produces I1, i.e., the zero degree current vector.

Figure 6:
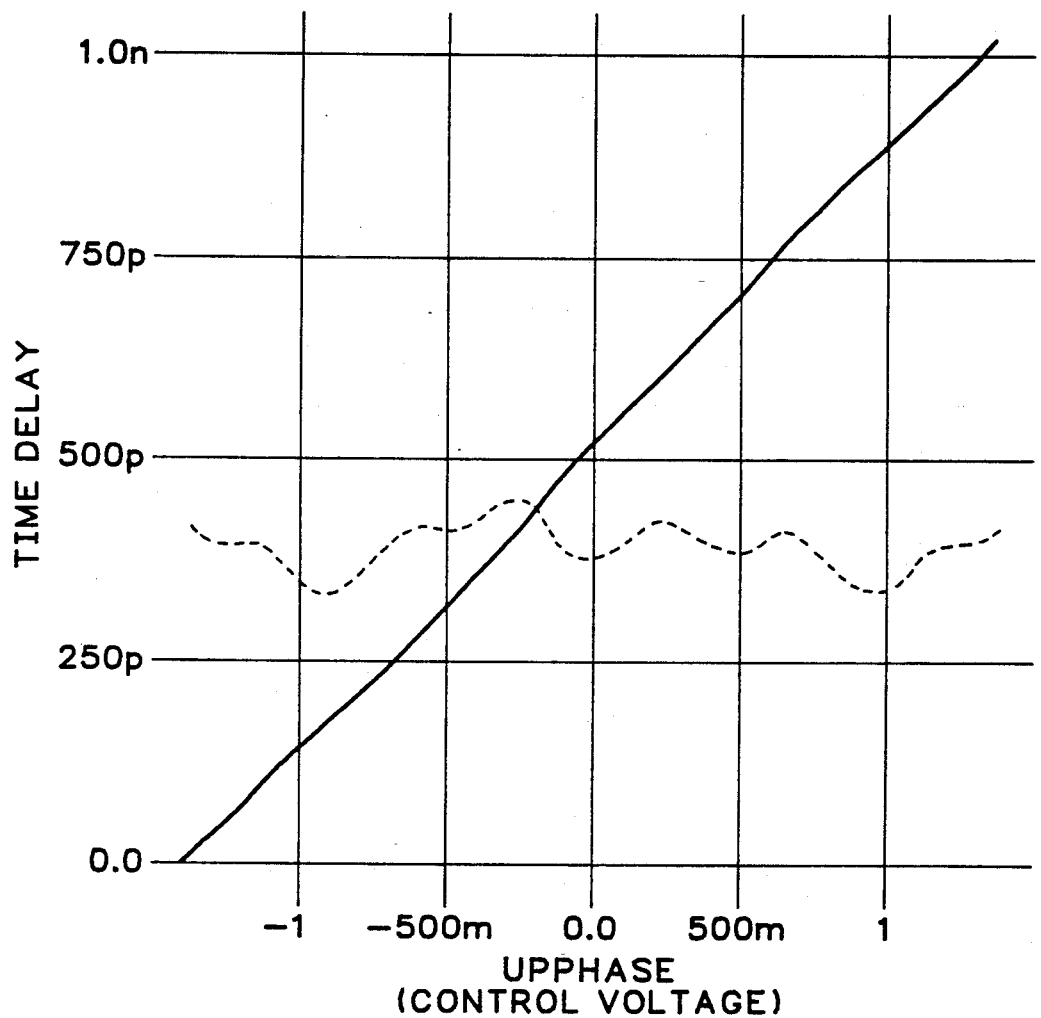
FIG. 6 is a graph illustrating the linearity of the low jitter clock phase adjust system of the present invention.

Likewise as PHS becomes more positive, then PHS− becomes more positive and PHS+ becomes more negative. This results in transistors Q8 being turned on in the sequence from A8D, Q8C, Q8B, Q8A, Q8E, Q8F to Q8G. Transistor Q7 are turned off in the same sequence until all transistors Q7 are off and all transistors Q8 are on. FIG. 5 illustrates the characteristics of the control circuit 28 in response to the control current PHS. The transitions for each current i0, i120 and i240 occur while the other two currents are constant, either on or off. Thus only one current changes at any given instant. Between −60° and 0° transistor Q8D gradually turns on, gradually supplying current to transistor Q7A, while transistor Q7D is gradually being turned off. This results in the transition from i240 to ni240 while i0 is constant and ni120 is constant. As shown in FIG. 6 the clock delay is virtually a linear function of the control voltage. The dotted line is the slope of the solid line, showing the non-linearity of the phase control function. Ideally the dotted line would be a horizontal line.

Thus the present invention provides a low jitter phase adjust scheme for a clock that has a greater than 360° adjustment range by dividing the input clock signal into three phases, and using two-quadrant multipliers so that only one phase control current varies at a time.

What is claimed is:
1. A low jitter clock phase adjust system comprising:
    means for dividing an input sinewave signal into three sinewave signals equally spaced apart from each other in phase;

means for multiplying each of the three sinewave signals by a separate control signal;

means for generating the separate control signals in response to an input phase control signal such that only one of the separate control signals varies at a time; and means for summing the outputs of the multiplying means to produce a phase delayed sinewave signal corresponding to the input sinewave signal.

2. A system as recited in claim 1 wherein the dividing means comprises at least two precision delay lines, each having as an input the input sinewave signal, to produce as two of the three sinewave signals a sinewave signal from one of the precision delay lines shifted one hundred twenty degrees output and a sinewave signal from the other of the precision delay lines shifted two hundred forty degrees output from the input sinewave signal.

3. A system as recited in claim 1 further comprising means for converting the three sinewave signals into three current vectors, the current vectors being input to the multiplying means.

4. A system as recited in claim 1 wherein the multiplying means comprises a trio of two-quadrature multipliers, each having as inputs a separate one of the three sinewave signals and the corresponding one of the separate control signals.

5. A system as recited in claim 1 wherein the multiplying means comprises a trio of two-quadrature multipliers, each having as inputs a unique pair of the three sinewave signals and the corresponding one of the separate control signals.

6. A system as recited in claim 1 wherein the generating means comprises a plurality of current switches coupled together and to the input phase control signal such that only one of the separate control signals varies while the other two remain constant.

7. A system as recited in claim 3 wherein the converting means comprises a trio of transistor emitter-coupled pairs, each pair having as inputs a unique pair of the three sinewave signals and producing as outputs corresponding pairs of the current vectors for input to the multiplying means.

8. A system as recited in claim 5 wherein each multiplier comprises a pair of emitter-coupled transistor pairs with the bases of the pair being cross-coupled and the bases of one pair being coupled to receive the separate control signal, the emitters of each pair being coupled to receive one of the unique pair of the three sinewave signals, and one collector of each pair being coupled to the summing means.

* * * * *